US005806177A

United States Patent [19]
Hosomi et al.

[11] Patent Number: 5,806,177
[45] Date of Patent: Sep. 15, 1998

[54] PROCESS FOR PRODUCING MULTILAYER PRINTED CIRCUIT BOARD

[75] Inventors: Takeshi Hosomi; Toyoaki Kishi; Tomoyoshi Honjoya; Sei Nakamichi; Masahiro Mitsui, all of Fujieda, Japan

[73] Assignee: Sumitomo Bakelite Company Limited, Tokyo, Japan

[21] Appl. No.: 740,186

[22] Filed: Oct. 28, 1996

[30]     Foreign Application Priority Data

Oct. 31, 1995  [JP]  Japan ................................ 7-284226
Nov. 9, 1995   [JP]  Japan ................................ 7-291170

[51] Int. Cl.$^6$ ....................................................... H05K 3/02
[52] U.S. Cl. ............................. 29/846; 156/233; 174/250
[58] Field of Search ....................... 29/846, 852; 156/233

[56]     References Cited

U.S. PATENT DOCUMENTS 4,528,064  7/1985  Ohsawa et al. .
4,687,528  8/1987  Held ..................................... 156/233 X
5,592,737  1/1997  Middleman et al. ............... 156/233 X

*Primary Examiner*—Carl J. Arbes
*Attorney, Agent, or Firm*—Browdy and Neimark

[57]     ABSTRACT

A process for producing a multilayer printed circuit board which comprises coating a light and heat curable undercoating agent on an internal layer circuit board, irradiating the undercoating agent with active energy beams to make the same tack-free, then laminating thereto a metal foil having an insulating adhesive layer and subsequently heating the resulting assembly to integrally cure the same. When the undercoating agent is coated on an internal layer circuit board and irradiated with a light to be made tack-free, and thereto is laminated a copper foil having a thermosetting insulating adhesive by a rigid roll or the like, the undercoating agent is softened or fluidized and the surface is smoothened. When the resulting laminate is thereafter heated, the undercoating agent coated on the internal layer circuit board and the insulating adhesive coated on the copper foil are integrally cured. Since the insulating adhesive coated on the metal foil keeps the thickness, a multilayer printed circuit board having an excellent board thickness precision can be produced without depending on the percentage of the remaining copper foil in the internal layer.

9 Claims, 2 Drawing Sheets

PROCESS FOR PRODUCING MULTILAYER PRINTED CIRCUIT BOARD

BACKGROUND OF THE INVENTION

1. Field of the Invention

This invention relates to a process for producing a multilayer printed circuit board which uses an internal layer circuit board coated with a light and heat curable undercoating agent and a metal foil having an insulating adhesive layer and which utilizes making the undercoating agent tack-free by irradiation with active energy beams and integrally curing the undercoating agent and the insulating adhesive by heating.

2. Description of the Related Art

As to a multilayer printed circuit board, miniaturization and multifunctionalization have proceeded in electronic devices and the technique is shifted in the direction of making the density higher. That is to say, the technique is proceeding in the direction of making the circuit pattern finer, allowing a printed circuit board to have many more layers, making the diameter of the via hole smaller and thinning the board or the like.

In the production of a multilayer printed circuit board, there has been used a process which comprises putting at least one sheet of a prepreg obtained by impregnating a glass cloth substrate with an epoxy resin and semi-curing the resin, on an internal layer circuit board on which a circuit has been formed, further putting a copper foil on the prepreg sheet and then molding the resulting assembly under heating by a hot plate press. However, in this process, the resin in the prepreg is allowed to flow again by heat and cured under a given pressure, and hence, a period of 1 to 1.5 hours is required for uniformly curing and molding the prepreg. Since the production process requires such a long period of time and in addition a multilayer lamination press and a glass cloth prepreg are costly, the production cost becomes high. Moreover, since a method of impregnating a glass cloth with a resin is carried out, it has been difficult to make the thickness between circuit layers much smaller.

In recent years, for solving the above problems, attention has been paid again to a technique of preparing a multilayer printed circuit board by a build-up system in which neither heat-pressure molding by a hot plate press nor glass cloth as an insulator between circuit layers is used.

In the production of a multilayer printed circuit board by a build-up system, when a copper-clad insulating sheet is used as an insulator between circuit layers, wherein an insulating resin layer is formed on the roughened surface of the copper foil or an insulating resin in the form of a film is provided, the working efficiency is remarkably increased as compared with a method of forming an insulating layer between the circuit layers using a prepreg. However, it is impossible to completely remove air present due to the difference in levels between insulating substrate and circuit in the internal layer circuit board, and hence, bubbles remain and cause bad insulation and deterioration of solder heat resistance, and, furthermore, delamination is caused in some cases, which has become a problem. For preventing these problems, the lamination must be carried out under reduced pressure, and hence, special equipment is required. Moreover, since the laminated insulating layer follows the difference in level between insulating substrate and circuit in the internal layer circuit board, there are such problems that no surface smoothness is obtained, soldering failure is caused when a completed part is mounted, the peeling-off of a resist is caused in the course of forming an etching resist, a reduction of pattern-developing degree is caused, the stabilized resist formation is impossible, and the like.

Moreover, similarly to the case of using a prepreg, the amount of a resin filled is varied depending upon the percentage of the remaining copper foil of a circuit pattern in the internal layer circuit board, so that even when a copper-clad insulating sheet or a film-like insulating resin is used, the thickness of the multilayer printed circuit board after molding does not become uniform. That is to say, when the percentage of the remaining copper foil is large and the portions to be filled with the resin are small, the board thickness becomes large, and when the percentage of the remaining copper foil is small and the portions to be filled with the resin are large, the board thickness becomes small, and hence it is not possible to achieve the same board thickness unless the thickness of an insulating sheet or film is varied depending upon the percentage of the remaining copper foil. Furthermore, even in the case of a single internal layer circuit board, there is such a disadvantage that the thickness of a multilayer printed circuit board obtained does not become uniform when the percentage of the remaining copper foil varies over different positions, and this has been a problem to be solved.

JP-A 7-202418, the inventors of which are the same as the present inventors, discloses an insulating adhesive similar to the present one; however, according to JP '418 no undercoating agent for filling up irregularities between circuits on the internal layer circuit board is used, and hence the multilayer printed circuit board obtained by laminating the insulating adhesive-coated copper foil and the internal layer circuit board to each other is insufficient in surface smoothness because of the difference in level between insulating substrate and circuit in the internal layer circuit board, and many voids remain therein. Therefore, it has been difficult to put the multilayer printed circuit board of JP '418 to practical use.

After that, it has become generally accepted that in the production of a multilayer printed circuit board by a build-up system, the internal layer circuit board is coated with an undercoating agent for diminishing the difference in level between insulating substrate and circuit in the internal layer circuit board to make its surface smoother. As a typical example thereof, various studies have been made on a method which comprises laminating a copper foil coated with an uncured, semi-cured or cured insulating adhesive to an internal layer circuit board coated with an undercoating agent, and curing the resulting assembly to thereby obtain a multilayer printed circuit board. By such a method, the difference in levels between insulating substrate and circuit and thus the unevenness in an internal layer circuit board is reduced, and hence there is merit in that the lamination of a copper foil coated with an insulating adhesive to the internal layer circuit board is made easy.

Such a technique is disclosed in JP-A 7-245480 of the same invention as the present inventors; however, in this technique, no curing agent is contained in the undercoating agent coated on the internal layer circuit board, so that when an insulating adhesive (similar to the insulating adhesive of this invention) is laminated to the internal layer circuit board coated with the undercoating agent and then heated, curing is not effected sufficiently; and therefore it has been impossible to put this technique to practical use.

SUMMARY OF THE INVENTION

It is an object of this invention to provide a process for producing a multilayer printed circuit board which is small in variation of thickness, smooth in surface and suitable for high density mounting as compared with a multilayer printed circuit board obtained by a method of molding using a prepreg as mentioned above or by a conventional build-up method.

Other objects and advantages of this invention will become apparent from the following description.

According to the present invention, there is provided a process for producing a multilayer printed circuit board which comprises coating a light and heat curable undercoating agent on an internal layer circuit board, irradiating the undercoating agent with active energy beams (e.g., a light such as ultraviolet ray or the like) to make the same tack-free, then laminating thereto a metal foil having an insulating adhesive layer thereon and thereafter heating the resulting assembly to integrally cure the same.

BRIEF DESCRIPTION OF THE DRAWING

In FIG. 1(A) to FIG. 1(C) and FIG. 2(A) to FIG. 2(C), 1 refers to an internal layer circuit board, 2 to an internal layer circuit, 3 to an undercoating agent, 4 to a thermosetting insulating adhesive, 5 to a copper foil, 6 and 18 to rigid rolls, 7 and 19 to multilayer printed circuit boards, 15 to a double layer structure metal foil, 16 to a copper foil layer and 17 to a metal layer (carrier).

DETAILED DESCRIPTION OF THE INVENTION

In this invention, the light and heat curable undercoating agent is preferably composed of:
(a) a normally solid epoxy resin having a softening point of not less than 45° C. but not more than 120° C.,
(b) an epoxy resin curing agent,
(c) a diluent in which the epoxy resin can be dissolved and which consists of a photopolymerizable monomer, and
(d) a photopolymerization initiator.

The insulating adhesive coated on a metal foil is preferably composed of:
(e) a bisphenol type epoxy resin or phenoxy resin having a weight average molecular weight of at least 10,000,
(f) a bisphenol type epoxy resin having an epoxy equivalent of not more than 500, and
(g) an epoxy resin curing agent, and said bisphenol type epoxy resin or phenoxy resin (e) having a weight average molecular weight of at least 10,000 is preferably a brominated one.

In this invention, the light and heat curable undercoating agent in the liquid state is coated on an internal layer circuit board by means of a screen printing, a roller coater, a curtain coater or the like, to fill the concaves between the copper foil circuits of the internal layer circuit board therewith, and then irradiated with a light (active energy beams) such as ultraviolet rays or the like to make the undercoating agent tack-free. Subsequently, a copper foil provided with an uncured or semi-cured insulating adhesive is laminated by means of a heated roll or the like to the internal layer circuit board coated with the undercoating agent. After the lamination, the resulting assembly is heated to subject both the light and heat-curable undercoating agent and the metal foil provided with an insulating adhesive to integral curing reaction, whereby a multilayer printed circuit board can be produced.

In the above lamination, the undercoating agent is heated by a roll or the like to be softened or fluidized and the thickness thereof is averaged by a roll pressure, so that the surface of the metal foil can be smoothened. The insulating adhesive coated on the copper foil is bonded to the internal layer circuit board by use of the epoxy resin or phenoxy resin component having a eight average molecular weight of at least 10,000 while keeping the thickness of the insulating layer. Therefore, the process of this invention can produce a multilayer printed circuit board whose thickness is not varied but becomes uniform and is excellent in precision without depending upon the percentage of the remaining copper foil in the internal layer circuit.

Figure 2A:
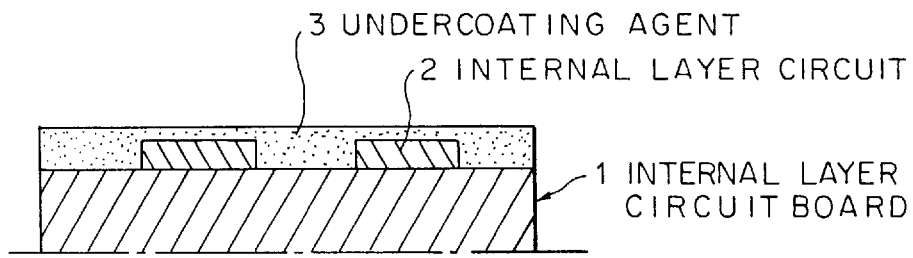
FIGS. 2(A) to 2(C) are schematic sectional views explaining another example of the process of producing a multilayer printed circuit board of this invention.
Figure 2B:
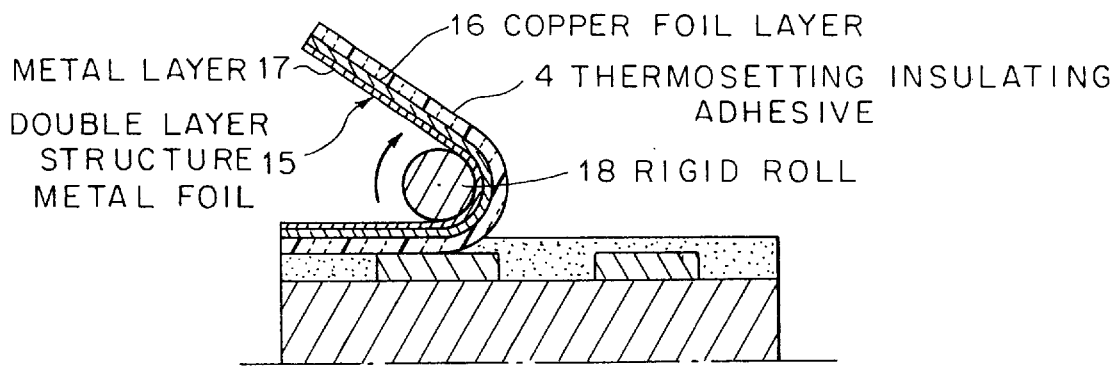
Figure 2C:
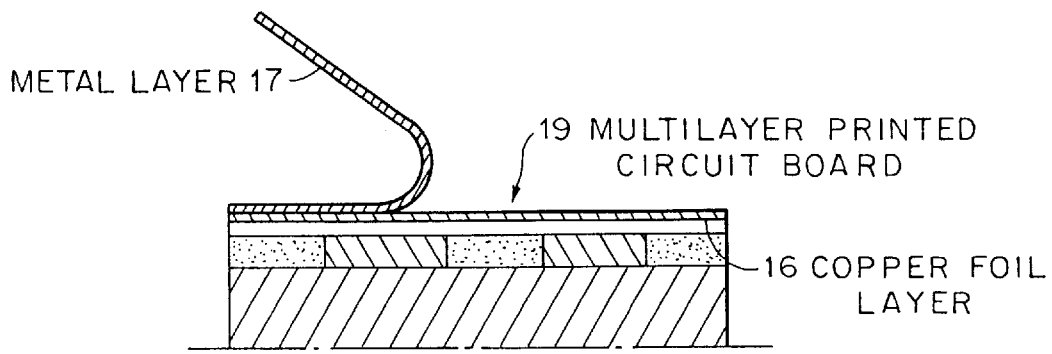

The metal foil used should be thick in order to prevent the metal foil from following the difference in level or height between insulating substrate and circuit in the internal layer circuit board during the lamination on the metal foil to the internal layer circuit board. However, when the metal foil is thick, it takes a long period of time in the subsequent etching step for the etching of the metal foil to form the circuit, so that there is caused such a disadvantage that it is difficult to form a circuit of sufficiently fine pattern. Therefore, when a circuit of fine pattern is particularly required, it is preferable to use a metal foil having a double layer structure having a total thickness of 11 to 250 μm which has a layer of a copper foil having a thickness of 1 to 50 μm which forms an outer circuit (after etching) and a metal layer (carrier) having a thickness of 10 to 200 μm which is to be removed after the lamination as illustrated in FIGS. 2(A)–2(C). In this way, because the metal foil 15 does not follow the difference in levels between the insulating substrate 4 and the circuit in the internal layer circuit board, satisfactory surface smoothness can be obtained during the lamination, and so a fine pattern outer circuit can be formed in the copper foil layer 16 in a shortened etching period of time in the step of forming a circuit after the removal of the metal carrier layer 17. As the removable metal carrier 17, aluminum, copper or the like is used, and the thickness thereof is 10 to 200 μm. When the thickness is less than 10 μm, the double layer metal layer 17 tends to follow the difference in levels between the insulating substrate and the internal circuit; and when the thickness is more than 200 μm, it is difficult for heat to transfer from the laminating roll 18 to the adhesive portion between the copper foil 16 and the internal layer circuit board 1 during lamination, which is not desirable. The thickness of the copper foil 16, which is subsequently etched to form the outer circuit, is 1 to 50 μm; and when this thickness is more than 50 μm, the copper foil 16 hardly follows the difference in level and the carrier foil 17 to be removed after the lamination becomes unnecessary.

In this invention, when the carrier metal layer is not used, the metal foil having an insulating adhesive layer is composed of a copper foil.

In this invention, the undercoating agent is filled into the concaves located between copper foil circuits in the internal layer circuit board to smoothen the surface of the internal layer circuit board. Such undercoating agent is preferably composed of:
(a) a normally solid epoxy resin having a softening point of not less than 45° C. but not more than 120° C.,
(b) an epoxy resin curing agent,
(c) a diluent in which the epoxy resin is dissolved and which consists of a photopolymerizable monomer, and
(d) a photopolymerization initiator, and it is more preferable that the epoxy resin curing agent is a high temperature-curable imidazole compound having a melting point of not less than 130° C., and the photopolymerizable monomer is at least one member selected from the group consisting of glycidyl acrylate, glycidyl methacrylate, hydroxyethyl acrylate, hydroxyethyl methacrylate and triethylene glycol dimethacrylate.

Furthermore, specifically, the undercoating agent is most preferably a composition consisting of:

(A) a brominated novolak type epoxy resin having a bromination degree of not less than 20% and a molecular weight of 500 to 4,000, (B) a bisphenol type epoxy resin having a molecular weight of 500 to 2,000, (C) a bisphenol type liquid epoxy resin having a molecular weight of not more than 500, (D) a high temperature-curable imidazole compound having a melting point of not less than 130° C., (E) a low temperature-curable imidazole compound, (F) glycidyl acrylate or glycidyl methacrylate, (G) hydroxyethyl acrylate, hydroxyethyl methacrylate or triethylene glycol dimethacrylate, and (d) a photopolymerization initiator.

The brominated novolak type epoxy resin having a bromination degree of not less than 20% and a molecular weight of 500 to 4,000 [the component (A)] is used for enhancing the heat resistance and flame retardancy, and is a normally solid, novolak type epoxy resin such as the phenol novolak type or cresol novolak type. The softening point of the component (A), when used together with the components (B) and (C), may be within the range of 50° C. to 150° C. When the bromination degree is less than 20%, it becomes difficult in many cases for the multilayer printed circuit board obtained to achieve Standard V-0 of the nonflammability UL Standards. In this connection the upper limit of the bromination degree corresponds to the case where all the brominatable positions of the benzene nuclei of the epoxy resin have been brominated, whereby the upper limit of bromination is determined.

The component (B) is a bisphenol type epoxy resin having a molecular weight of 500 to 2,000 and is used mainly for enhancing the flexibility and adhesiveness between the internal layer circuit board and the insulating adhesive and the interaction with the component (A) and the component (C) affects the heat resistance, voidlessness and surface smoothness. When the molecular weight exceeds 2,000, the viscosity of the undercoating agent increases, the fluidity and ability to fill the concaves between the internal layer circuits are deteriorated and the surface smoothness becomes bad, and hence, such a molecular weight is not desirable.

The component (C) is a bisphenol type liquid epoxy resin having a molecular weight of not more than 500 and is blended particularly for enhancing the ability to fill the concaves between the internal layer circuits, the wettability to the internal layer circuit board, the voidlessness and the surface smoothness. When the molecular weight exceeds 500, these effects are diminished, and hence, such a molecular weight is not desirable.

The photopolymerizable monomer (C) used in the light and heat curable undercoating agent is preferably glycidyl acrylate or glycidyl methacrylate [the component (F)] which has an excellent heat-curability or hydroxyethyl acrylate, hydroxyethyl methacrylate or triethylene glycol dimethacrylate [the component (G)]. These components serve as a solvent for the epoxy resin and are used for obtaining the so-called solventless type undercoating agent.

The components (F) and (G) react upon irradiation with a light and the polymerization thereof makes the undercoat layer tack-free. When the component (F) is heated, the glycidyl group thereof reacts with the curing agent whereby the component (F) is cured together with the epoxy resin, so that the heat resistance of the undercoating agent is increased and the generation of voids is inhibited. The proportion of each of these components blended is appropriately determined in the range of from 20% to 80% by weight based on the total weight of the two. The total amount of the components (F) and (G) is preferably 20 to 100 parts by weight, more preferably 30 to 70 parts by weight, per 100 parts by weight of a total of the epoxy resins.

The photopolymerization initiator (D) includes benzophenones such as benzophenone, benzoylbenzoic acid, 4-phenylbenzophenone, hydroxybenzophenone and the like; benzoin; benzoin alkyl ethers such as benzoin ethyl ether, benzoin isopropyl ether, benzoin butyl ether, benzoin isobutyl ether and the like; acetophenones such as 4-phenoxydichloroacetophenone, 4-t-butyl-dichloroacetophenone, 4-t-butyl-trichloroacetophenone, diethoxyacetophenone, 2,2-dimethoxy-2-phenylacetophenone and the like; thioxanthones such as thioxanthone, 2-chlorothioxanthone, 2-methylthioxanthone, 2,4-dimethylthioxanthone and the like; alkylanthraquinones such as ethylanthraquinone, butylanthraquinone and the like; etc. These may be used alone or in admixture of two or more. The amount of the photopolymerization initiator (D) added is preferably 0.1 to 10 parts by weight per 100 parts by weight of the photopolymerizable monomer.

As the epoxy resin curing agent (B), the component (D) is preferably used.

The high temperature-curable imidazole compound (D) has a melting point of not less than 130° C., is small in solubility in the epoxy resin and rapidly reacts with the epoxy resin at a high temperature not lower than about 150° C., and is added for curing the epoxy resin. The component (D) includes specifically 2-methylimidazole, 2-phenylimidazole, 2-phenyl-4-methylimidazole, bis(2-ethyl-4-methylimidazole), 2-phenyl-4-methyl-5-hydroxymethylimidazole, 2-phenyl-4,5-dihydroxymethylimidazole, triazine-addition type imidazole and the like. Epoxy adducts of them and microcapsules of them can also be used. These may be used alone or in combination of two or more.

More preferably, the component (E) is used together with the component (D). The low temperature-curable imidazole compound (E) is well soluble in the epoxy resin and reacts with the epoxy resin at a relatively low temperature range of from 60° C. to 120° C. This curing agent is used for allowing the epoxy resin to start the reaction at the initial stage of heating. When the undercoating agent and the insulating adhesive are integrally cured, it becomes important for molding that the curing reaction starts from the undercoating agent side. Specific examples used as the component (E) include imidazole, 2-ethyl-4-methylimidazole, 2-undecylimidazole, 1-cyanoethyl-2-methylimidazole, 1-cyanoethyl-2-phenylimidazole, 1-cyanoethyl-2-ethyl-4-methylimidazole, 1-aminoethyl-2-methylimidazole, 1-(cyanoethylaminoethyl)-2-methylimidazole, 1-cyanoethyl-2-phenyl-4,5-bis(cyanoethoxymethyl) imidazole and the like. Epoxy adducts of them and microcapsules of them can also be used. These may be used alone or in combination of two or more.

In this case, the amount of the epoxy resin curing agent is varied depending upon the kind of the curing agent, and the total amount of the component (D) and the component (E)

is 1 to 10 parts by weight per 100 parts by weight of the epoxy resin, and the proportion of the component (E) is appropriately determined depending upon the desired reaction starting temperature and the melt viscosity of the undercoating agent.

In addition, the light and heat curable undercoating agent may, if necessary for storage stability, have added thereto an ultraviolet inhibitor, a heat-polymerization inhibitor, a plasticizer or the like. Also, for adjusting the viscosity, there can be added an acrylate monomer, a methacrylate monomer, a vinyl monomer or the like. Moreover, there can be incorporated an inorganic filler such as molten silica, crystalline silica, calcium carbonate, aluminum hydroxide, alumina, barium sulfate, mica, talc, clay, white carbon, E glass powder or the like, and there can be added an epoxysilane coupling agent for improving the adhesiveness to the copper foil and internal layer circuit board and the moisture resistance, a defoaming agent for preventing voids or a liquid or powdery flame retardant, or the like.

The light and heat-curable undercoating agent comprising these components is a substantially solventless liquid composition but, because it is a liquid, it fills in the concave areas between copper foil circuits in the internal layer circuit board to smoothen the surface of the internal layer circuit surface. Moreover, the undercoating agent can be easily solidified upon irradiation with light and the made tack-free.

Component (C) in the formulated undercoating agent of this invention initially acts as a solvent to dissolve the component (A) and other components to convert the undercoating agent to a liquid. Accordingly, the undercoating agent flows into and fills in the concave areas between copper foil circuits in an internal layer circuit board to smoothen the surface of the internal layer circuit surface. Furthermore, the component (C) acting initially as a solvent is polymerized upon irradiation with a light to become solid and, accordingly, loses its liquid state and hence deposit the component (A). Then, the polymerized component (C) and other components are dispersed in the solid component (A). Accordingly, the undercoating agent of this invention is made tack-free upon irradiation with a light when the component (A) is selected so that the component (A) alone is in an appropriate tack-free state at ordinary temperature. Such a mechanism of making the undercoating agent tack-free is one of the most characteristic features of this invention.

Furthermore, the component (C) polymerized by irradiation with a light has a heat-reactive functional group, too, and hence, is reacted with the curing agent to be cured similarly to the main component epoxy resin during the subsequent heating. Therefore, the cured undercoating agent is excellent in heat resistance, chemical resistance and the like.

By co-using, as the photopolymerizable monomer, a compound having at least one acryloyl or methacryloyl group and at least one glycidyl group in one molecule and a compound having at least one acryloyl or methacryloyl group and at least one hydroxyl group in one molecule in the above-mentioned manner, the undercoating agent is well made tack-free upon irradiation with a light and the integral curing after the lamination to a copper foil having an insulating adhesive layer is well conducted, whereby a multilayer printed circuit board which is free from voids and excellent in surface smoothness and has good characteristics can be prepared.

The insulating adhesive which is coated on the copper foil used in this invention is preferably composed of:

(e) a bisphenol type epoxy resin or phenoxy resin having a weight average molecular weight of at least 10,000, (f) a bisphenol type epoxy resin having an epoxy equivalent of not more than 500, and (g) an epoxy resin curing agent, and has good adhesiveness and good heat resistance.

In this invention, the bisphenol type epoxy resin or phenoxy resin (e) having a weight average molecular weight of at least 10,000 is blended for the purpose of diminishing the degree of softening of the resin during molding, keeping the thickness of an insulating layer and imparting a flexibility to the composition obtained. Said epoxy resin includes bisphenol A type epoxy resins, bisphenol F type epoxy resins and the like.

When the above high molecular weight epoxy resin or phenoxy resin is used alone, the adhesive is poor in fitness and adhesiveness during laminating, insufficient in adhesiveness after lamination and too low in cross-linking density after curing to ensure heat resistance; and when the resin is dissolved in a solvent to form a varnish for coating a copper foil the viscosity thereof is so high that the fitness and workability during coating are not desirable. In order to overcome these drawbacks, the bisphenol type epoxy resin having an epoxy equivalent of not more than 500 which is the component (f), is blended.

The proportion of this high molecular weight epoxy resin or phenoxy resin is preferably 55 to 90% by weight based on the total weight of the two resins (accordingly, the proportion of the component (f) blended is preferably 10 to 45% by weight based on the total weight of the two resins). When the proportion is less than 55% by weight, the resin is too much softened by heating during the lamination to ensure the insulating film thickness between circuit layers. In addition, there are caused in some cases such problems that the melt viscosity is too much lowered during heat-curing and wrinkle is formed on the copper foil. On the other hand, when the proportion is more than 90% by weight, the adhesive before curing is hard and lacks elasticity, so that the property of following the irregularities of the internal layer circuit board during laminating and the adhesiveness are inferior and voids are caused.

In addition to the above purposes, for imparting a flame retardancy to the composition, a brominated bisphenol type epoxy resin or brominated phenoxy resin having a bromination degree of 20% or more is preferred as the component (e). When the bromination degree is less than 20%, the multilayer printed circuit board obtained cannot achieve Standard V-O of the Nonflammability UL Standards. Moreover, for enhancing the dissolution in other resins, solvents or the like, a brominated epoxy resin or brominated phenoxy resin having a repeating structure in which brominated bisphenol portion and unbrominated bisphenol portion are alternately arranged, is preferred.

Said epoxy resin which is the component (f) includes bisphenol A type epoxy resins, bisphenol F type epoxy resins and the like which have an epoxy equivalent of not more than 500. When brominated products thereof are used, a flame retardancy is more effectively imparted to the multilayer printed circuit board. More specifically, those having an epoxy equivalent of about 200 and those having an epoxy equivalent of about 450 are used alone or in combination taking into consideration the workability in coating a copper foil.

As the epoxy resin curing agent (g), it is preferable to use the same imidazole compound as the component (D) used in the undercoating agent. This is added for the purpose of reacting with the epoxy resin at a high temperature in the vicinity of 150° C. to finally cure the epoxy resin.

The said imidazole compounds are particularly preferably those which are normally solid, have a melting point of not less than 130° C., are low in solubility in epoxy resins and rapidly react with the epoxy resin when the temperature reaches a high temperature of not less than 150° C. Specifically, they include 2-methylimidazole, 2-phenylimidazole, 2-phenyl-4-methylimidazole, bis(2-ethyl-4-methylimidazole), 2-phenyl-4-methyl-5-hydroxymethylimidazole, 2-phenyl-4,5-dihydroxymethylimidazole, triazine-addition type imidazole and the like. These imidazoles are uniformly dispersed in the form of fine powder in an epoxy resin varnish. In addition, since they are low in compatibility with the epoxy resin, no reaction proceeds at a temperature of room temperature to 100° C., and hence, storage stability can be maintained well. When they are heated to not less than 150° C. in the curing of the laminate, they react with the epoxy resin to prepare a uniform cured product.

In addition to the above epoxy resins and curing agent, components which can react with the epoxy resins and curing agent can be added to the insulating adhesive. Said components include, for example, reactive epoxy diluents (including phenyl glycidyl ether and the like as a monofunctional type; resorcin diglycidyl ether, ethylene glycol glycidyl ether and the like as a difunctional type; glycerol triglycidyl ether and the like as a trifunctional type); resole type or novolak type phenol resins; isocyanate compounds; and the like.

In addition to the above-mentioned components, molten silica, crystalline silica, calcium carbonate, aluminum hydroxide, alumina, clay, barium sulfate, mica, talc, white carbon, E glass fine powder and the like may be blended in a proportion of not more than 40% by weight of the resin content in order to enhance the linear expansion coefficient, heat resistance, flame resistance and the like of the adhesive. When the proportion is more than 40% by weight, the viscosity of the adhesive becomes high and the adhesiveness to the internal layer circuit board and the ability to fill concaves between the internal layer circuits become low.

Furthermore, there can be added a silane coupling agent such as an epoxysilane or the like or a titanate type coupling agent in order to enhance the adhesiveness with a copper foil and an internal layer circuit board and the humidity resistance, a defoaming agent in order to prevent voids from being formed, or a flame retardant in the form of a liquid or fine powders.

As the solvent, there must be selected those which do not remain in the adhesive after the adhesive coated on a copper foil has been dried at 80°–130° C. For example, acetone, methyl ethyl ketone, toluene, xylene, n-hexane, methanol, ethanol, methyl Cellosolve, ethyl Cellosolve, cyclohexanone and the like can be used.

The copper foil having an insulating adhesive layer is prepared by coating an adhesive varnish in which the adhesive components are dissolved in a given solvent on the roughened surface of a copper foil, and thereafter drying the coated copper foil at 80°–130° C. so that the solvent does not remain in the adhesive. The thickness of the adhesive layer is preferably 15–120 $\mu$m. When the thickness is less than 15 $\mu$m, the insulating properties between the circuit layers become insufficient in some cases, and when the thickness is more than 120 $\mu$m, the coating is not easy though the insulating properties between the circuit layers have no problem, and such a large thickness does not meet the purpose of this invention, that is, the thinning of the multilayer printed circuit board.

The insulating adhesive coated on the copper foil is laminated to an internal layer circuit board coated with an undercoating agent in the state that the thickness of the insulating adhesive layer is kept because the insulating adhesive comprises an epoxy resin or phenoxy resin having a weight average molecular weight of at least 10,000, so that it becomes possible to produce a multilayer printed circuit board whose thickness is not varied and is excellent in precision without depending upon the percentage of the remaining copper foil in the internal layer circuit. However, this cannot be realized unless the undercoating agent coated on an internal layer circuit board is softened or fluidized by heating with a hot roll so that the thickness of the resultant multilayer printed circuit board, obtained by laminating the coated copper foil to the internal circuit board, is averaged by the roll pressure at the time of lamination. Furthermore, the softening or liquidizing of the undercoating agent greatly contributes also to the enhancement of the adhesiveness of the undercoating agent to the insulating adhesive. That is to say, at the interface therebetween, they are merged together or dissolved in each other and curing reaction therebetween is caused, so that they come to participate in the reliability of insulation characteristic between the circuit layers or the like.

However, during the heat-curing, the undercoating agent is affected by the curing shrinkage of the insulating adhesive or the like when the curing reaction of the undercoating agent is caused after the curing reaction of the insulating adhesive and the melt viscosity thereof is lowered unnecessarily, and failures such as wrinkles, formation of voids and the like are thereby caused in some cases. On the other hand, when the undercoating agent used in this invention contains the component (E), the reaction in a low temperature region is accelerated, and the unnecessary lowering of the melt viscosity can be inhibited during heating, so that in the heat-curing under substantially no pressure, it becomes possible to achieve good smoothness, good adhesiveness between layers and the like.

Figure 1A:
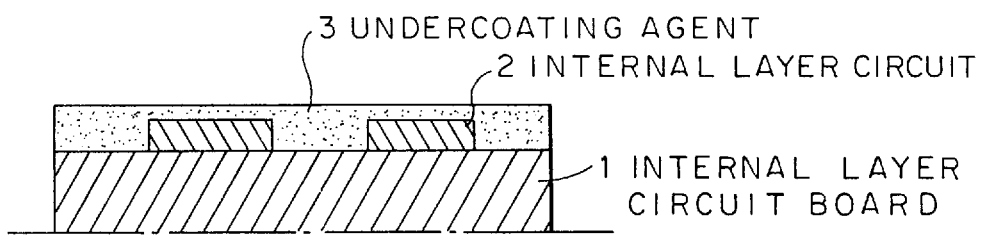
FIG. 1(A) to FIG. 1(C) are schematic sectional views explaining an example of the process of producing a multilayer printed circuit board of this invention.
Figure 1B:
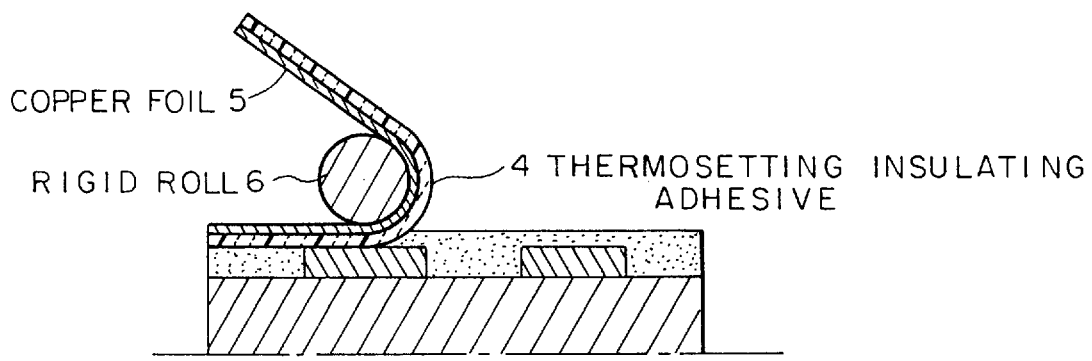
Figure 1C:
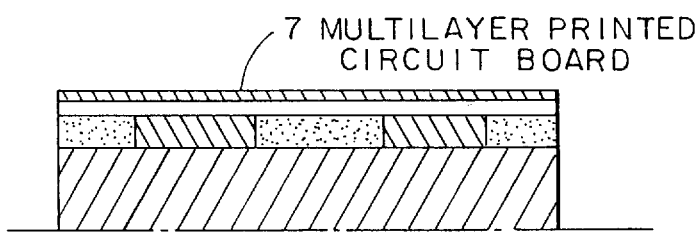

Referring to FIG. 1(A) to FIG. 1(C), there is explained below the outline of the process for producing a multilayer printed circuit board of this invention, namely a process which comprises coating an undercoating agent on an internal layer circuit board, laminating thereto a copper foil provided with an insulating adhesive and then curing the resulting assembly.

FIG. 1(A): A liquid undercoating agent (3) is coated on an internal circuit board (1) by a screen printing or using a conventional coating means such as a roller coater, a curtain coater or the like in such a thickness that one surface of the internal layer circuit board (1) is completely covered with the undercoating agent (3). When the amount of the undercoating agent coated is insufficient, it follows that air is caught up during the subsequent lamination. Thereafter, the undercoating agent is made tack-free by irradiation with a light. Subsequently, the other surface of the internal layer circuit board (1) is coated with an undercoating agent (3) in the same manner [this step is omitted in FIG. 1(A)].

FIG. 1(B): A copper foil (5) provided with a thermosetting insulating adhesive (4) is laminated to the surface of the tack-free undercoat layer coated on the internal layer circuit board. As the laminator, for example, a pair of rigid rolls (6) covered with a silicone rubber are used for achieving surface smoothness and the copper foils each provided with an insulating adhesive are laminated to both surfaces of the internal layer circuit board (1). The laminating conditions are varied depending upon the pattern of the internal layer circuit; however, the lamination is usually conducted at a pressure of about 0.5 to 6 kgf/cm$^2$ at a surface temperature of from room temperature to about 100° C. at a laminating speed of about 0.1 to 6 m/min. Under such conditions, the photopolymerized tack-free undercoating agent can achieve the surface smoothness by use of the rigid roll (6). In this case, the thickness of a layer between the internal layer circuit (2) and the copper foil (5) can be substantially achieved by the thickness of the insulating adhesive (4).

FIG. 1(C): Subsequently, the undercoating agent (3) and the thermosetting insulating adhesive (4) coated on the copper foil are simultaneously integrally cured by heating to prepare a multilayer printed circuit board.

FIG. 2(A) to FIG. 2(C) explain the case of using as the metal foil a metal foil of a double layer structure consisting of a copper foil layer which forms a circuit and a metal layer (carrier) which is to be removed after the lamination. In this case, after the step of FIG. 2(A) which is the same as FIG. 1(A), the undercoating agent (3) and the thermosetting insulating adhesive (4) coated on the metal foil (15) of the above double layer structure are integrally cured in the step of FIG. 2(B), and subsequently the metal layer (17) which is the carrier foil of the double layer structure metal foil is removed in the step of FIG. 2(C), whereby a multilayer printed circuit board (19) having a copper foil layer (16) which forms the outer layer circuit can be prepared.

According to this invention, by coating an undercoating agent on an internal layer circuit board, irradiating the undercoating agent with a light to make the same tack-free, and laminating thereto a metal foil provided with a thermosetting insulating adhesive by a rigid roll or the like, the undercoating agent is softened or fluidized and the surface is smoothened. Thereafter, the resulting laminate is heated to integrally cure the undercoating agent coated on the internal layer circuit board and the insulating adhesive coated on the metal foil. Since the insulating adhesive coated on the metal foil keeps the thickness, a multilayer printed circuit board having an excellent thickness precision can be produced without depending on the percentage of the remaining copper foil in the internal layer circuit. The resulting multilayer printed circuit board has good heat resistance and furthermore can have excellent flame retardancy by use of a brominated epoxy resin or brominated phenoxy resin.

Thus, according to this invention, the production of a multilayer printed circuit board by a build-up method is made very easy.

DESCRIPTION OF THE PREFERRED EMBODIMENTS

Examples are shown below to explain this invention in more detail. However, the Examples are merely by way of illustration and not by way of limitation. In the Examples, parts are by weight unless otherwise specified.

EXAMPLE 1

In 170 parts of methyl ethyl ketone (MEK) were dissolved 100 parts of a brominated phenoxy resin (bromination degree: 25%, weight average molecular weight: 30,000) and 70 parts of a bisphenol F type epoxy resin (epoxy equivalent: 175, molecular weight: 380) with stirring, and thereto were added 4 parts of 2-phenyl-4-methylimidazole as a curing agent and 20 parts of a silane coupling agent (A-187, a trade name of Nippon Unicar Co., Ltd.) to prepare an insulating adhesive varnish. This varnish was coated on the roughened surface of a copper foil having a thickness of 18 μm so that the thickness after drying became 40 μm, by means of a roller coater, and dried to prepare an insulating adhesive-coated copper foil.

Separately, 100 parts of a brominated cresol novolak epoxy resin (bromination degree: 35%, epoxy equivalent: 280, weight average molecular weight: 1,400), 100 parts of a bisphenol A type epoxy resin (epoxy equivalent: 950, weight average molecular weight: 1,600) and 40 parts of a bisphenol F type epoxy resin (epoxy equivalent: 175, molecular weight: 380) were dissolved in 50 parts of glycidyl methacrylate and 70 parts of hydroxyethyl methacrylate, and to the solution were added 4 parts of 2-phenyl-4-methylimidazole and 8 parts of 1-cyanoethyl-2-ethyl-4-methylimidazole as curing agents and 10 parts of a photopolymerization initiator (Irgacure 651, a trade name of Ciba Geigy for 2,2-dimethoxy-2-phenylacetophenone), and they were mixed thoroughly in a homomixer to prepare an undercoating agent.

A flame-retardant type, glass epoxy double-side copper-clad laminate having a substrate thickness of 0.2 mm and a copper foil thickness of 35 μm was subjected to pattern processing to obtain an internal layer circuit board. The surface of the copper foil was subjected to black oxide treatment, and then the above-mentioned undercoating agent was coated on one surface of the internal layer circuit board in a thickness of about 25 μm by a screen printing. Subsequently, the resulting internal layer circuit board was irradiated with active energy beams under the condition of about 2 J/cm$^2$ using two high pressure mercury vapor lamps of 80 W/cm to make the undercoat layer tack-free. Thereafter, the same undercoat layer was prepared also on the other surface of the internal layer circuit board. Subsequently, the above-mentioned insulating adhesive-coated copper foils were laminated to the undercoat layers under the conditions of a temperature of 100° C., a pressure of 2 kg/cm$^2$ and a lamination speed of 0.8 m/min using a twin roll, and then the resulting assembly was heat-cured at 150° C. for 30 minutes to prepare a multilayer printed circuit board.

EXAMPLES 2 TO 6

The same procedure as in Example 1 was repeated, except that as the curing agent for epoxy resin in the undercoating agent and the insulating adhesive, the 2-phenyl-4-methylimidazole was replaced with 2-methylimidazole (Example 2), 2-phenylimidazole (Example 3), bis(2-ethyl-4-methylimidazole (Example 4), 2-phenyl-4-methyl-5-hydroxymethylimidazole (Example 5) or 2-phenyl-4,5-dihydroxymethylimidazole (Example 6), to prepare multilayer printed circuit boards.

EXAMPLE 7

The same procedure as in Example 1 was repeated, except that as the curing agent for epoxy resin in the undercoating agent, 10 parts of 2-phenyl-4-methylimidazole was used alone in place of 4 parts of 2-phenyl-4-methylimidazole and 8 parts of 1-cyanoethyl-2-ethyl-4-methylimidazole, to prepare a multilayer printed circuit board.

EXAMPLE 8

The same procedure as in Example 1 was repeated, except that in the undercoating agent, 120 parts of glycidyl methacrylate was used in place of the glycidyl methacrylate and the hydroxyethyl methacrylate, to prepare a multilayer printed circuit board.

EXAMPLE 9

The same procedure as in Example 1 was repeated, except that in the undercoating agent, 120 parts of hydroxyethyl methacrylate was used in place of the glycidyl methacrylate and the hydroxyethyl methacrylate, to prepare a multilayer printed circuit board.

EXAMPLE 10

The same procedure as in Example 1 was repeated, except that a copper foil having a double layer structure consisting of a copper carrier having a thickness of 70 μm and a copper foil layer having a thickness of 9 μm was used as the copper foil, the double layer structure copper foil provided with the thermosetting insulating adhesive was laminated to the internal layer circuit board coated with the undercoating agent and the resulting assembly was heat-cured, after which the copper carrier was peeled off, to prepare a multilayer printed circuit board having a 9 μm thick copper foil for an outer layer circuit.

COMPARATIVE EXAMPLE 1

The same procedure as in Example 1 was repeated, except that in the undercoating agent, 100 parts of diethylene glycol monoethyl ether was substituted for the glycidyl methacrylate and the hydroxyethyl methacrylate, the irradiation with active energy beams was not conducted and the undercoat layer was heated at 150° C. for 20 minutes to dry and precure the same, to prepare a multilayer printed circuit board.

COMPARATIVE EXAMPLE 2

In the same manner as in Example 1, except that the undercoating agent was not coated, a multilayer printed circuit board was prepared.

The multilayer printed circuit boards obtained were subjected to the following tests to obtain the characteristics shown in Table 1.

Test method

1. Surface smoothness: R (max) was measured according to JIS B 0601.
2. Test of solder heat resistance after moistened: Moisture absorption conditions: Pressure cooker treatment at 125° C. at 2.3 atms for 30 minutes.
Test conditions: Test piece was floated on a solder bath at 280° C. for 120 seconds.
The case where n=5 and all test pieces were not blistered was indicated as "o", the case where 1–4 test pieces were blistered was indicated as "Δ" and the case where all test pieces were blistered was indicated as "x".
3. Filling property: The outer layer copper foil was peeled off and then the ability of the resin material to fill the concaves between internal layer circuits was judged visually through an optical microscope.
The case where the concaves were completely filled with the undercoating agent was indicated as "o", the case where the concaves were insufficiently filled with the undercoating agent was indicated as "Δ", and the case where the concaves were not filled with the undercoating agent and voids were present was indicated as "x".
4. Thickness of insulating layer between circuit layers: The multilayer printed circuit board was cut and the cross-section was observed through an optical microscope to determine the thickness of insulating layer between the internal layer circuit and the surface copper foil.
5. Voids residue: The whole of the copper foil surface of the multilayer printed circuit was etched and whether there were voids was measured visually.
The case where no voids remained was indicated as "o", the case where voids remained slightly was indicated as "Δ" and the case where voids were completely observed was indicated as "x".
6. Flame retardancy: According to UL Standards 94.

TABLE 1

|  | Ex. 1 | Ex. 2 | Ex. 3 | Ex. 4 | Ex. 5 | Ex. 6 | Ex. 7 | Ex. 8 | Ex. 9 | Ex. 10 | Comp. Ex. 1 | Comp. Ex. 2 |
| --- | --- | --- | --- | --- | --- | --- | --- | --- | --- | --- | --- | --- |
| Surface smoothness (μm) | 3 | 5 | 3 | 3 | 3 | 3 | 3 | 8 | 5 | 2 | 20 | 30 |
| Solder heat resistance after moistened | o | o | o | o | o | o | o | o | Δ | o | x | x |
| Filling property | o | o | o | o | o | o | o | o | o | o | Δ | x |
| Insulating layer thickness between layers (μm) | 60 | 60 | 60 | 60 | 60 | 60 | 60 | 65 | 60 | 60 | 65 | 40 |
| Voids residue | o | o | o | o | o | o | Δ | o | Δ | o | Δ | x |
| Flame retardancy | V-0 | V-0 | V-0 | V-0 | V-0 | V-0 | V-0 | V-0 | V-0 | V-0 | V-0 | V-0 |

What is claimed is:

1. A process for producing a multilayer printed circuit board, which comprises
    coating a light and heat curable undercoating agent on an internal layer circuit board,
    irradiating the undercoating agent with active energy beams to make the same tack-free but not fully cured,
    then laminating thereto a metal foil having an insulating adhesive layer to at least soften said undercoating agent and join with said insulating adhesive layer, and
    subsequently heating the resulting assembly to integrally cure the same.

2. The process for producing a multilayer printed circuit board according to claim 1, wherein the metal foil is a metal foil having a double layer structure having a total thickness of 11 to 250 μm composed of a copper layer having a thickness of 1 to 50 μm which forms a circuit and a metal layer having a thickness of 10 to 200 μm which is to be removed after the lamination.

3. The process for producing a multilayer printed circuit board according to claim 1, wherein the light and heat curable undercoating agent comprises as essential components:

(a) a normally solid epoxy resin having a softening point of not less than 45° C. but not more than 120° C., (b) an epoxy resin curing agent, (c) a diluent in which the epoxy resin is dissolved and which consists of a photopolymerizable monomer, and (d) a photopolymerization initiator.

4. The process for producing a multilayer printed circuit board according to claim 1, wherein the insulating adhesive layer comprises as essential components:

(e) a bisphenol type epoxy resin or phenoxy resin having a weight average molecular weight of at least 10,000, (f) a bisphenol type epoxy resin having an epoxy equivalent of not more than 500, and (g) an epoxy resin curing agent.

5. The process for producing a multilayer printed circuit board according to claim 4, wherein in the insulating adhesive layer, the bisphenol type epoxy resin or phenoxy resin (e) having a weight average molecular weight of at least 10,000 is a brominated one.

6. The process for producing a multilayer printed circuit board according to claim 1, wherein the light and heat curable undercoating agent comprises as essential components:

(a) a normally solid epoxy resin having a softening point of not less than 45° C. but not more than 120° C., (b) an epoxy resin curing agent, (c) a diluent in which the epoxy resin is dissolved and which consists of a photopolymerizable monomer, and (d) a photopolymerization initiator, and the insulating adhesive layer comprises as essential components:

(e) a bisphenol type epoxy resin or phenoxy resin having a weight average molecular weight of at least 10,000, (f) a bisphenol type epoxy resin having an epoxy equivalent of not more than 500, and (g) an epoxy resin curing agent.

7. The process for producing a multilayer printed circuit board according to claim 6, wherein in the insulating adhesive layer, the bisphenol type epoxy resin or phenoxy resin (e) having a weight average molecular weight of at least 10,000 is a brominated one.

8. The process for producing a multilayer printed circuit board according to claim 3, wherein the metal foil is a metal foil having a double layer structure having a total thickness of 11 to 250 μm composed of a copper layer having a thickness of 1 to 50 μm which is adapted to be formed into a circuit, and a removable metal layer backing having a thickness of 10 to 200 μm which is adapted to be removed after the lamination.

9. A process for producing a multilayer printed circuit board, which comprises coating a heat-curable undercoating agent on an internal layer circuit board, said heat-curable undercoating agent being capable of being solidified to a tack-free state when subjected to irradiation and then being capable of being softened or liquified upon the application of heat, said undercoating agent comprising (a) a normally solid epoxy resin, (b) a curing agent for said epoxy resin, (c) a photopolymerizable monomer in which said epoxy resin is initially dissolved, and (d) a photopolymerization initiator, to provide a coated internal layer circuit board;

irradiating said undercoating agent with active energy beams to make said undercoating agent a tack-free coating;

then laminating a metal foil having an insulating adhesive layer thereon to said tack-free coating under heat to soften or liquify said undercoating agent, said insulating adhesive layer being in contact with said undercoating agent so as to form a merged interface; and heating the resulting assembly to integrally cure the same with said merged interface of said insulating adhesive layer and said undercoating agent being cured together.

* * * * *